(12) United States Patent
Ciocchini et al.

(10) Patent No.: US 12,131,788 B2
(45) Date of Patent: Oct. 29, 2024

(54) READ COUNTER ADJUSTMENT FOR DELAYING READ DISTURB SCANS

(71) Applicant: Micron Technology, Inc., Boise, ID (US)

(72) Inventors: Nicola Ciocchini, Boise, ID (US); Animesh R. Chowdhury, Boise, ID (US); Kishore Kumar Muchherla, Fremont, CA (US); Akira Goda, Tokyo (JP); Jung Sheng Hoei, Newark, CA (US); Niccolo' Righetti, Boise, ID (US); Jonathan S. Parry, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 245 days.

(21) Appl. No.: 17/895,886

(22) Filed: Aug. 25, 2022

(65) Prior Publication Data
US 2024/0071522 A1 Feb. 29, 2024

(51) Int. Cl.
*G11C 7/00* (2006.01)
*G11C 16/08* (2006.01)
*G11C 16/26* (2006.01)
*G11C 16/34* (2006.01)

(52) U.S. Cl.
CPC .......... *G11C 16/3427* (2013.01); *G11C 16/08* (2013.01); *G11C 16/26* (2013.01)

(58) Field of Classification Search
CPC ....... G11C 7/22; G11C 7/1006; G11C 7/1072; G11C 7/1066
USPC .............................. 354/189.15, 189.14, 236
See application file for complete search history.

(56) References Cited

U.S. PATENT DOCUMENTS

2017/0177425 A1* 6/2017 Jei .................... G06F 11/076

* cited by examiner

*Primary Examiner* — Son T Dinh
(74) *Attorney, Agent, or Firm* — NICHOLSON DE VOS WEBSTER & ELLIOTT LLP (57) ABSTRACT

Methods, systems, and apparatuses include receiving a read command including a logical address. The read command is directed to a portion of memory composed of blocks and each block is composed of wordline groups. The physical address for the read command is identified using the logical address. The wordline group is determined using the physical address. A slope factor is retrieved using the wordline group. A read counter is incremented using the slope factor.

20 Claims, 6 Drawing Sheets

READ COUNTER ADJUSTMENT FOR DELAYING READ DISTURB SCANS

TECHNICAL FIELD

The present disclosure generally relates to mitigating read disturb, and more specifically, relates to read counter adjustment for delaying read disturb scans.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Aspects of the present disclosure are directed to read counter adjustment in a memory subsystem. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dice. One example of non-volatile memory devices is a negative-and (NAND) memory device. Other examples of non-volatile memory devices are described below in conjunction with FIG. 1. The dice in the packages can be assigned to one or more channels for communicating with a memory subsystem controller. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit that stores information.

Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple-level cells (TLCs), and quad-level cells (QLCs). For example, a SLC can store one bit of information and has two logic states.

Data reliability in a memory can degrade as the memory device increases in density (e.g., device components scale down in size, when multiple bits are programmed per cell, etc.). One contributor to this reduction in reliability is read disturb. Read disturb occurs when a read operation performed on one portion of the memory (e.g., a row of cells/wordline), often referred to as the aggressor, impacts the threshold voltages in another portion of memory (e.g., a neighboring row of cells/wordline), often referred to as the victim. Memory devices typically have a finite tolerance for these disturbances. A sufficient amount of read disturb effects, such as a threshold number of read operations performed on neighboring aggressor cells, can change the victim cells to different logical states than originally programmed, which results in errors.

Memory subsystems can use read counters to measure how many times the wordlines in a block have been read and execute a read disturb scan (also called a data integrity scan) when the counter reaches a threshold value. The threshold value for the counter is conventionally set to the worst case of stress caused by read disturb, e.g., as a function of gate voltage for the wordline that has the greatest read disturb stress under repeated read operations, referred to as row hammer stress. Given that the amount of stress caused by read disturb can vary for different portions of memory and different read patterns, read disturb scans triggered based on the worst-case scenario often occur when there is not a high likelihood of read disturb at a level that would cause problems. While a read disturb scan may not lead to refreshing a portion of memory, these read disturb scans can cause host collisions and impact the quality of service (QoS) of the system.

Aspects of the present disclosure address the above and other deficiencies by using read counter adjustment to delay read disturb scans based on the variance of read disturb stress between portions of memory. For example, the read counter adjustments may be based on different cell sensitivities to the application of a gate voltage. Each wordline or group of wordlines may have different sensitivities to the application of a gate voltage due to variabilities introduced during manufacturing. The read counter adjustment may also be based on how close a victim wordline is to the aggressor wordline. Because the adjusted read counter is more accurate, read disturb scans can be delayed. As a result, the system can perform fewer read disturb scans, reducing host collisions and improving QoS.

Figure 1:
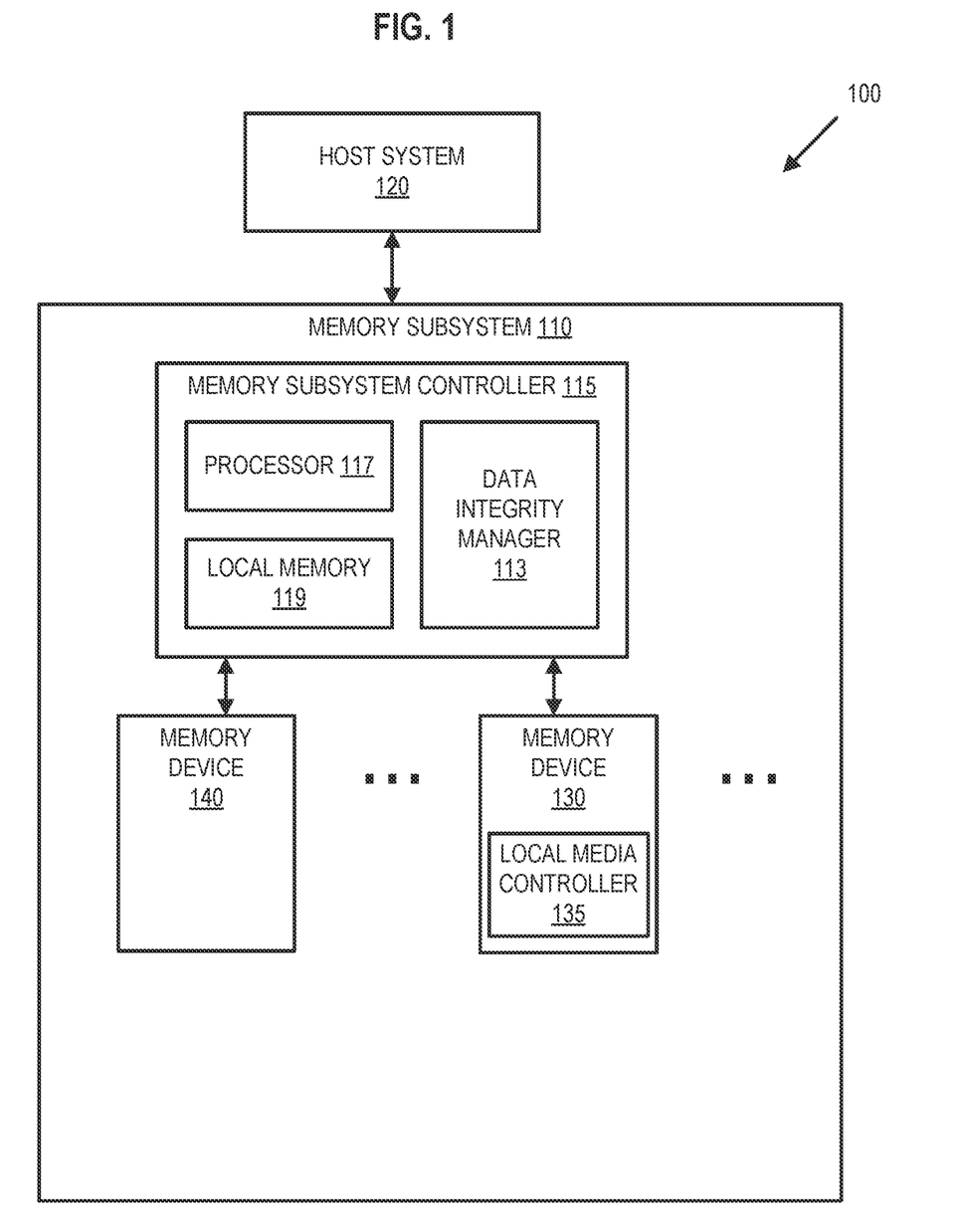
FIG. 1 illustrates an example computing system that includes a memory subsystem in accordance with some embodiments of the present disclosure.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or operations from the host system 120 and can convert the commands or operations into instructions or appropriate commands to achieve the desired access to the memory devices 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes a data integrity manager 113 that can adjust a read counter based on read disturb stress. In some embodiments, the controller 115 includes at least a portion of the data integrity manager 113. For example, the controller 115 can include a processor 117 (processing device) configured to execute instructions stored in local memory 119 for performing the operations described herein. In some embodiments, a data integrity manager 113 is part of the host system 120, an application, or an operating system.

The data integrity manager 113 manages read disturb counters and data integrity scans for different portions of memory device(s) 140. For example, the data integrity manager 113 can adjust a read counter increment amount based on a read disturb stress slope factor for a specific wordline or wordline group. Further details with regards to the operations of the data integrity manager 113 are described below.

Figure 2:
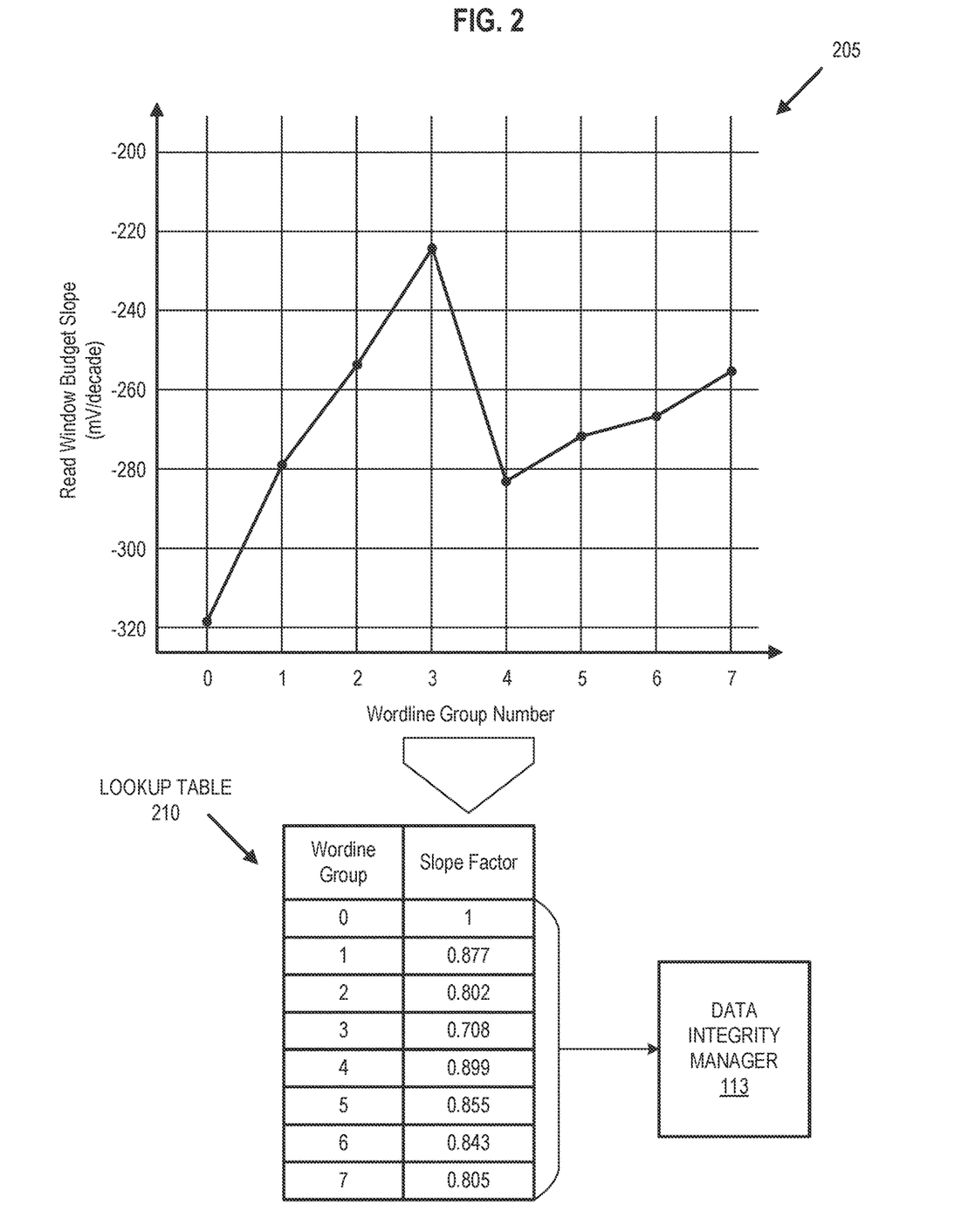
FIG. 2 illustrates an example system for read counter adjustment including a data integrity manager in accordance with some embodiments of the present disclosure.

FIG. 2 illustrates an example system for read counter increment adjustment including a data integrity manager 113 in accordance with some embodiments of the present disclosure. FIG. 2 includes a read window budget slope graph 205 representing different read window budget (RWB) slope values for different wordline groups which can be used to determine read counter increment adjustment values in lookup table 210. Read window budget slope graph 205 is illustrated for visualization of an example to show how different wordline groups can have different RWB slopes. The RWB slope of the wordline refers to the change in RWB over a given number of program/erase cycles or read counts. In one embodiment, read count refers to a count of reads that have a read disturb impact on a given portion of memory. In another embodiment, read count refers to the count of reads on a given portion of memory regardless of whether there is a read disturb impact. RWB slopes are determined by several factors, including the gate voltage of the wordline and the cell sensitivity of the wordline to the gate voltage and, in one embodiment, serve as an indicator of sensitivity to read disturb stress. The sensitivity varies from wordline to wordline based on manufacturing variabilities, such as the thickness of the material deposited. As shown in read window budget slope graph 205, RWB slopes are measured in millivolts (mV) per decade or similar metrics. In some embodiments, a decade is measured as a number of block cycles, such as 10,000 block program/erase cycles. In other embodiments, a decade may be measured as an amount of elapsed time or another metric.

While the illustrated example maps RWB slopes to wordline groups, embodiments can map RWB slopes to different subsets of memory. In some embodiments, wordline groups are groups of wordlines that do not necessarily contain the same number of wordlines. Likewise, the number of wordline groups may differ according to the system requirements. In some embodiments, wordlines with similar RWB slopes are placed into groups such that each wordline group corresponds with a different RWB slope. The RWB slope for a wordline group may be a worst-case RWB slope, an average RWB slope, or another metric representative of the RWB slope for wordlines in the wordline group. In some embodiments wordline groups are composed of an individual wordline rather than multiple wordlines.

Lookup table 210 is stored in memory, such as local memory 119 or memory device 140 of FIG. 1. In some embodiments, lookup table 210 is written to memory based on known wordline group information, e.g., from manufacturing. In some embodiments, lookup table 210 is updated when data integrity manager 113 conducts a read disturb scan. For example, read counter adjust 113 conducts a read disturb scan and estimates the current RWB for the wordline groups. Data integrity manager 113 determines the change in RWB or the RWB slope for the wordline groups. Data integrity manager 113 updates lookup table 210 based on the new RWB slope for the wordline groups.

As shown in lookup table 210, each of the wordline groups is associated with a slope factor. The slope factor is based on the RWB slope for each wordline group, like those shown in read window budget slope graph 205. For example, the slope factors are determined by comparing the RWB slope for a wordline group to the RWB slope of the worst wordline group. The worst wordline group is the wordline group with the steepest RWB slope. In the example illustrated by read window budget slope graph 205, wordline group 0 has the steepest RWB slope around −320 mV/decade and is therefore the worst wordline group.

In some embodiments, the slope factor for a wordline group is determined by dividing the RWB slope for that wordline group by the RWB slope for the worst wordline group. In such embodiments, the slope factor for the worst wordline group is normalized to 1 and the remaining wordline groups have a slope factor between zero and one. In other embodiments, the slope factor for a wordline group is determined through a similar operation involving the relative difference between the RWB slope for a given wordline group and the RWB slope of the worst wordline group such that the slope factor is normalized based on the slope factor for the wordline group with the worst RWB slope.

Data integrity manager 113 uses the logical address or translated physical address from a read command to determine which wordline group is targeted by the read command. Data integrity manager 113 uses lookup table 210 to find the slope factor for the corresponding wordline group. Data integrity manager 113 increments the read disturb counter by the corresponding slope factor. Further details with regards to the operations of the data integrity manager 113 are described below. The read counter is a counter indicating how many read operations have occurred in a given portion of memory. Different sizes may be used for the portion of memory, such as a wordline read counter, a wordline group read counter, a block read counter, a plane read counter, a super block read counter, and a LUN read counter, among others. In some embodiments, the logical or physical address includes multiple wordline groups from lookup table 210 for the same read counter (e.g., a block read counter). In such embodiments, read counter adjuster 113 increments the block read counter by the highest wordline group slope factor. In other embodiments, read counter adjuster 113 increments the block read counter by an average or sum of the wordline group slope factors. In still other embodiments, read counter adjuster 113 increments the block read counter using a different operation on the wordline group slope factors.

Figure 3:
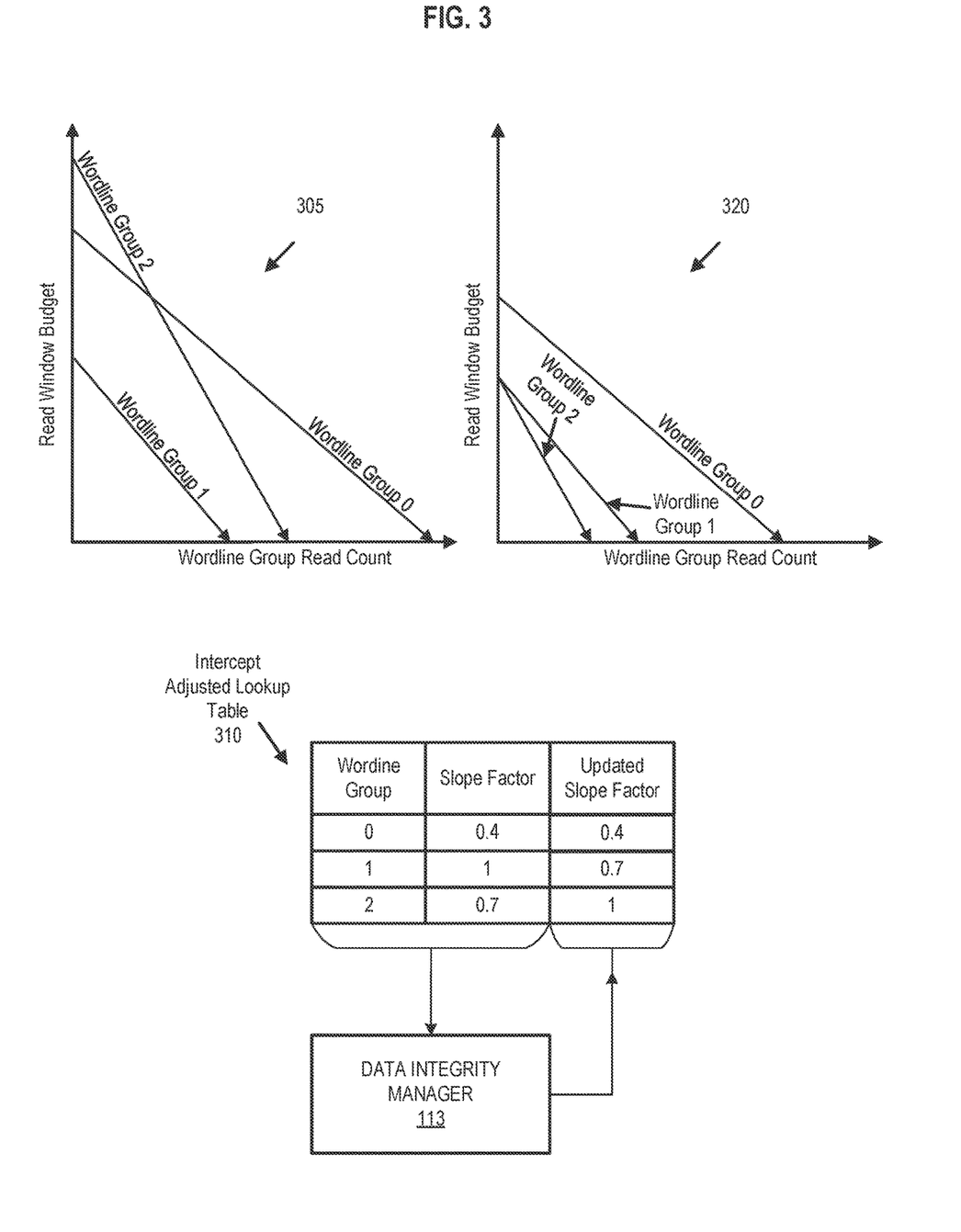
FIG. 3 illustrates an example system for read counter adjustment including a data integrity manager in accordance with some embodiments of the present disclosure.

FIG. 3 illustrates an example system for read counter adjustment including a data integrity manager 113 in accordance with some embodiments of the present disclosure. FIG. 3 includes read window budget graph 305, representing initial RWB intercept and slope values for different wordline groups determined at a first point in time, read window budget graph 320, representing the same wordline groups with values determined at a second point in time, and an intercept adjusted lookup table 310. Read window budget graph 305 is illustrated for visualization of an example to show how different wordline groups can have different initial RWB as well different RWB slopes. The combination of RWB intercept value (e.g., where the RWB line intercepts the axis representing read window budget) and RWB slope value determines the read count at which a given wordline group is expected to reduce RWB to zero or another RWB value at which the memory subsystem cannot be reliably differentiate values. In the example illustrated by read window budget graph 305, the order of steepest to most moderate RWB slopes is: wordline group 2, wordline group 1, and finally wordline group 0. Therefore, using only the technique discussed in FIG. 2, wordline group 2 would be categorized as the worst wordline and would have the largest slope factor. This approach, however, does not consider the initial RWB of the wordline groups. The order of highest to lowest initial RWB is: wordline group 2, wordline group 0, and finally wordline group 1. As shown in read window budget graph 305, the result of factoring in these differing initial RWBs is that wordline group 1 is predicted to run out of RWB (i.e., intercept the x-axis) at a smaller read count than wordline group 2, even though wordline group 2 has a steeper RWB slope.

As shown in intercept adjusted lookup table 310, each of the wordline groups is associated with a slope factor based on the different RWB slopes and the different initial RWBs, like those shown in read window budget graph 305. For example, the slope factors are determined by comparing the RWB slopes and the initial RWBs for the different wordline groups. In some embodiments, the worst wordline group is the wordline group that runs out of RWB budget at the smallest read count. In the example illustrated by read window budget graph 305, wordline group 1 runs out of RWB before any of the other wordlines and is therefore the worst wordline group. Since wordline group 1 is the worst wordline group, the slope factors of wordline group 2 and wordline group 0 are smaller than they would be in embodiments using only the RWB slope (i.e., wordline group 2 slope factor is 0.7 in the current example instead of 1 if data integrity manager 113 only considered RWB slope). For example, the slope factors are normalized to the worst slope factor with the slope factor of wordline group 1 being one and the slope for the other wordlines being lower than one. In some embodiments, the slope factors are based on combinations of the initial RWB for the wordline groups, the read count for the wordline groups, the remaining RWB for the wordline groups, the RWB slope for the wordline groups, and the predicted read count when wordline groups run out of RWB.

Read window budget graph 320 shows that read count increases of wordline groups is not necessarily uniform. For example, RWB Read window budget graph 320 illustrates the same wordline groups with the same slopes as read window budget graph 305. Read window budget graph 320, however, represents a latter point in time where wordline groups 0, 1, and 2 have lowered RWB s due to higher read counts (represented by different y-axis intercept values than in RWB graph 305). Notably, however, wordline group 1 has a smaller read count increase than either of wordline group 2 or wordline group 0. Wordline group 1, therefore, also has a smaller read window budget decrease than either of wordline group 0 or wordline group 2. This results in wordline group 2 having the same outstanding RWB as wordline group 1 (i.e., the two wordline groups have the same y-axis intercept value in RWB graph 320). Because wordline group 2 has a steeper slope, wordline group 2 is now predicted to run out of RWB at a smaller read count than wordline group 1 and wordline group 0.

In some embodiments, as shown in intercept adjusted lookup table 310, each of the wordline groups is also associated with an updated slope factor based on updated RWB margins, like those shown in read window budget graph 320. The y-axis of read window budget graph 320 indicates the wordline group's outstanding RWB for the current read count. Data integrity manager 113 updates the slope factor in intercept adjusted lookup table 310 using actual read counts over time, as represented by RWB graph 320.

In some embodiments, data integrity manager 113 updates the slope factor in response to each read disturb scan. For example, during a read disturb scan, data integrity manager 113 estimates the outstanding RWB for the each of the wordline groups using the RWB slope and read count. As explained above, data integrity manager 113 determines updated slope factors based on one or more of: the initial RWB for the wordline groups, the read count for the wordline groups, the outstanding RWB for the wordline groups, the RWB slope for the wordline groups, and/or the predicted read count when wordline groups run out of RWB.

Figure 4:
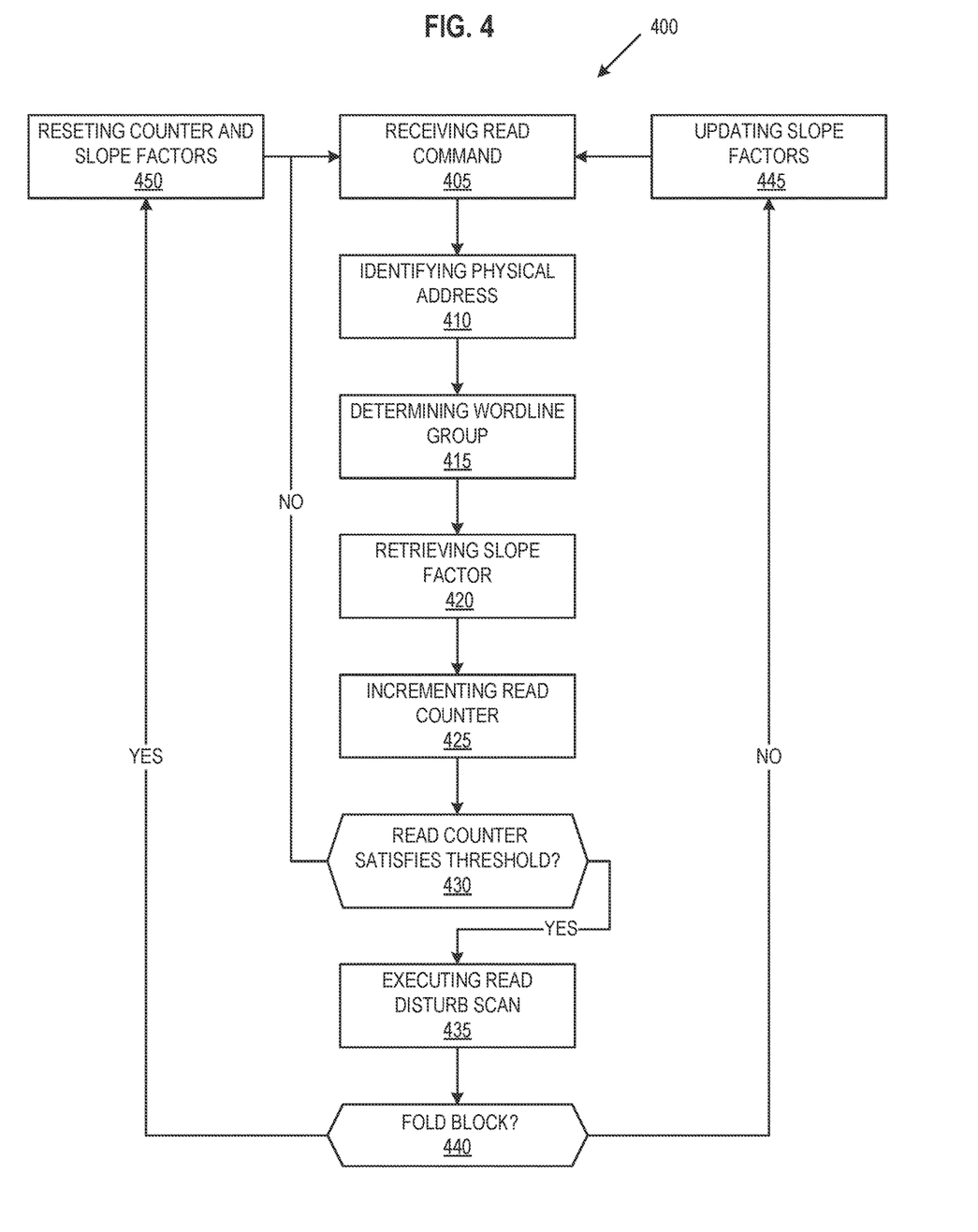
FIG. 4 is a flow diagram of an example method to adjust a read counter in accordance with some embodiments of the present disclosure.

FIG. 4 is a flow diagram of an example method 400 to adjust a read counter to delay read disturb scans, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the data integrity manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, the processing device receives a read command. For example, the data integrity manager 113 receives a read command from a host device, such as host system 120 of FIG. 1 with a logical address.

At operation 410, the processing device identifies a physical address. For example, the data integrity manager 113 translates the logical address to a physical address using a lookup table or other data structure.

At operation 415, the processing device determines a portion of memory, such as a wordline group, that has an independent slope factor as described above. For example, the data integrity manager 113 determines a wordline group to read based on the physical address. In some embodiments, the physical address indicates multiple wordline groups to be read.

At operation 420, the processing device retrieves the slope factor for the portion of memory subject to the read command. For example, the data integrity manager 113 retrieves the slope factor from the lookup table for the wordline group identified in the read command (such as lookup table 210 of FIG. 2 or intercept adjusted lookup table 310 of FIG. 3). In some embodiments, the processing device identifies multiple slope factors if the read command identifies multiple wordline groups.

At operation 425, the processing device increments the read counter. For example, the data integrity manager 113 increments the read counter by the slope factor for the wordline group identified in the read command. In some embodiments, the read counter is a counter determining how many read operations have occurred in a given portion of memory. Different sizes may be used for the portion of memory, such as a wordline read counter, a wordline group read counter, a block read counter, a plane read counter, a super block read counter, and a LUN read counter, among others.

In some embodiments, if there are multiple slope factors retrieved for the same read counter (e.g., a block read counter), the processing device increments the block read counter by the highest of the wordline group slope factors. In other embodiments, the processing device increments the block read counter by an average or sum of the wordline group slope factors. In still other embodiments, the processing device increments the block read counter using a different operation involving the wordline group slope factors.

At operation 430, the processing device determines whether the read counter satisfies a threshold. For example, the data integrity manager 113 determines if the read counter is greater than or equal to a threshold value to determine whether to execute a read disturb scan. In some embodiments, the threshold is predetermined based on initial RWBs and RWB slopes. In other embodiments, the threshold may be changed depending on the tasks of the overall system, the environment for the overall system, and other factors. In some embodiments, each of the blocks (or other unit of read counter granularity) has a different threshold based on characteristics of that block. If the read counter satisfies the threshold, the method 400 proceeds to operation 435. If the read counter does not satisfy the threshold, the method 400 returns to operation 405 and waits for the next read command.

At operation 435, the processing device executes a read disturb scan. For example, the data integrity manager 113 scans the block (or other unit of read counter granularity) to determine whether the data stored in the block satisfies a refresh threshold. For example, the data integrity manager 113 executes a read disturb scan to determine a number of errors in the portion of memory. In some embodiments, the processing device determines estimated RWBs for the wordline groups based on the results of the read disturb scan. For example, the data integrity manager 113 issues multiple read strobes at different offsets for a given read level. Using these read strobes, the data integrity manager determines two read strobes for which the read voltage value for the given read level satisfies an error correction threshold (e.g., a maximum bit error count). Data integrity manager 113 estimates the RWB for the wordline groups using the read strobes (e.g., a difference in voltage between the two read strobes).

At operation 440, the processing device determines whether to fold the portion of memory. For example, the data integrity manager 113 uses the results of the read disturb scan from operation 435 to determine whether the number of errors detected in the data integrity scan satisfies a refresh threshold. If the number of errors detected satisfies the refresh threshold, the data integrity manager 113 uses an error correction scheme to rewrite the data (e.g., to a different block) and the method 400 proceeds to operation 450. If the number of errors detected does not satisfy the refresh threshold, the method 400 proceeds to operation 445.

At operation 445, the processing device updates the slope factors. For example, the data integrity manager 113 determines updated slope factors for the wordline groups based on combinations of the outstanding the initial RWB for the wordline groups, the read count for the wordline groups, the outstanding RWB for the wordline groups, the RWB slope for the wordline groups, and the predicted read count when wordline groups run out of RWB as described with reference to FIG. 3. The processing device then updates the lookup table based on the updated slope factors.

At operation 450, the processing device resets the read counter and the slope factors. For example, data integrity manager 113 resets the read counter to zero or a default value and resets the slope factors to default values. In some embodiments, the default values for the slope factors are based on the results of the read disturb scan from operation 435. In other embodiments, the default values for the slope factors are stored in memory based on known wordline group information, e.g., from manufacturing.

Figure 5:
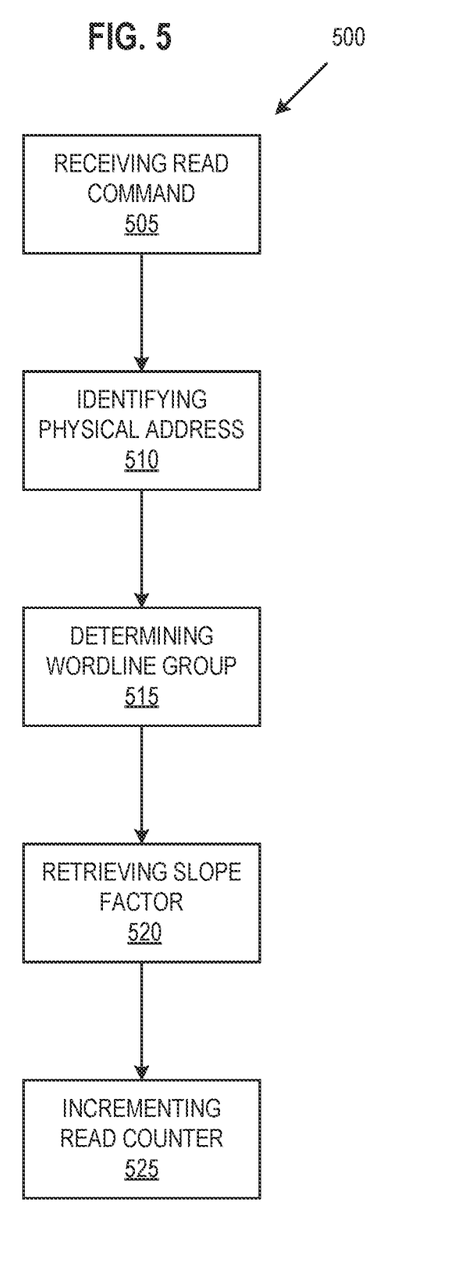
FIG. 5 is a flow diagram of an example method to adjust a read counter in accordance with some embodiments of the present disclosure.

FIG. 5 is a flow diagram of an example method 500 to adjust a read counter to delay read disturb scans, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the data integrity manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 505, the processing device receives a read command. For example, the data integrity manager 113 receives a read command from a host device, such as host system 120 of FIG. 1 with a logical address.

At operation 510, the processing device identifies a physical address. For example, the data integrity manager 113 translates the logical address to a physical address using a lookup table or other data structure.

At operation 515, the processing device determines a portion of memory, such as a wordline group, that has an independent slope factor as described above. For example, the data integrity manager 113 determines a wordline group to read based on the physical address. In some embodiments, the physical address indicates multiple wordline groups to be read.

At operation 520, the processing device retrieves a slope factor for the portion of memory subject to the read command. For example, the data integrity manager 113 accesses a lookup table (such as lookup table 210 of FIG. 2 or intercept adjusted lookup table 310 of FIG. 3). In some embodiments, the lookup table is stored in memory, such as local memory 119 of FIG. 1. In some embodiments, the processing device identifies multiple slope factors if the read command identifies multiple wordline groups.

At operation 525, the processing device increments the read counter according to the slope factor. For example, the data integrity manager 113 increments the read counter by the slope factor for the wordline group identified in the read command. In some embodiments, the read counter is a counter determining how many read operations have occurred in a given portion of memory. Different sizes may be used for the portion of memory, such as a wordline read counter, a wordline group read counter, a block read counter, a plane read counter, a super block read counter, and a LUN read counter, among others.

In some embodiments, if there are multiple slope factors retrieved for the same read counter (e.g., a block read counter), the processing device increments the block read counter by the highest of the wordline group slope factors. In other embodiments, the processing device increments the block read counter by a sum of the wordline group slope factors. In still other embodiments, the processing device increments the block read counter using a different operation involving the wordline group slope factors.

Figure 6:
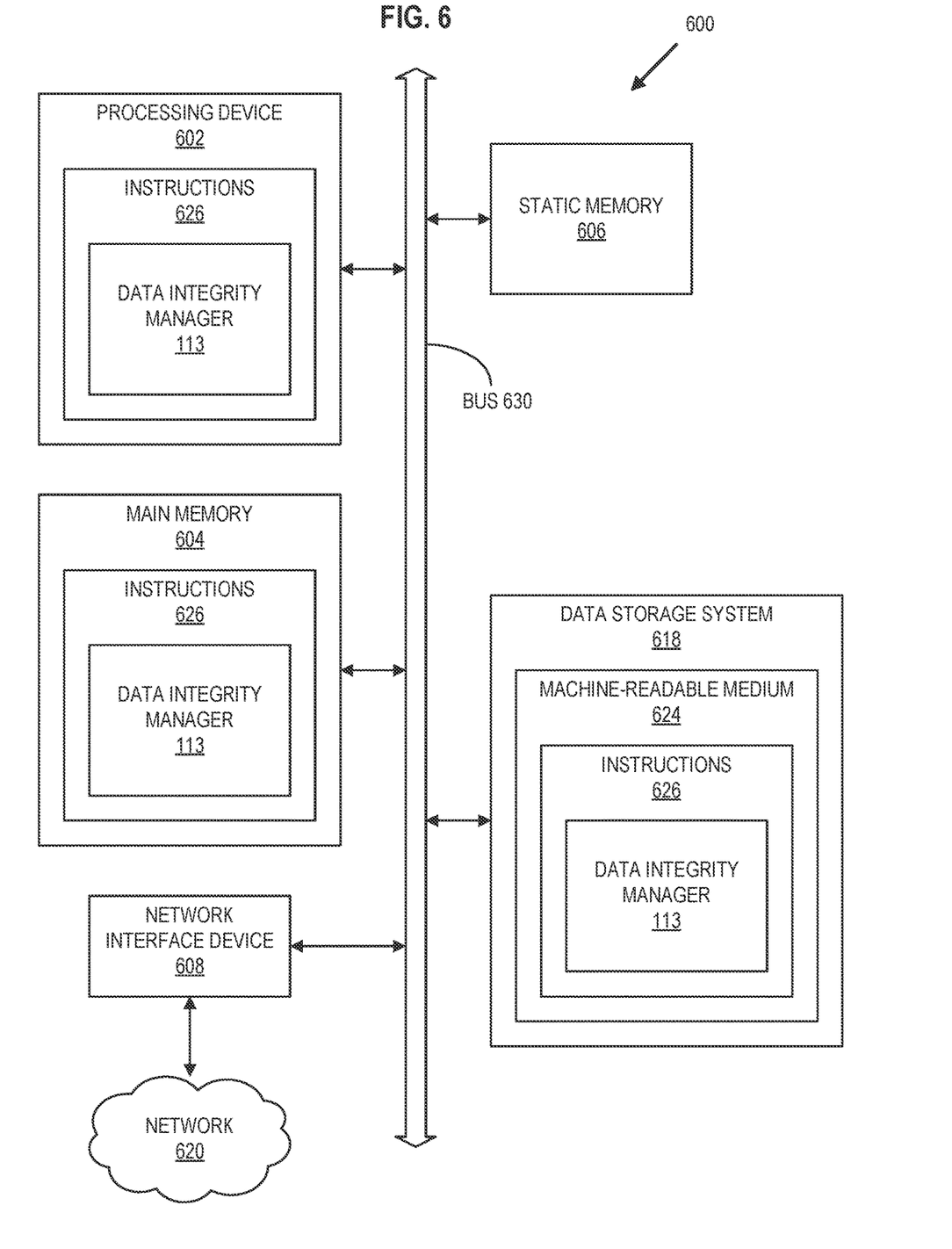
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the data integrity manager 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory subsystem 110 of FIG. 1.

In one embodiment, the instructions 626 include instructions to implement functionality corresponding to a data integrity manager (e.g., the data integrity manager 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, may carry out the computer-implemented methods 400 and 500 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   receiving a read command including a logical address, wherein the read command is directed to a portion of memory composed of a plurality of blocks and wherein each of the plurality of blocks is composed of a plurality of wordline groups;
   identifying a physical address for the read command using the logical address;
   determining a wordline group of the plurality of wordline groups using the physical address;
   retrieving a slope factor of a plurality of slope factors using the wordline group; and
   incrementing a read counter using the slope factor.

2. The method of claim 1, further comprising:
   determining that the incremented read counter satisfies a read counter threshold; and
   executing a data integrity scan in response to the incremented read counter satisfying the read counter threshold.

3. The method of claim 1, wherein retrieving the slope factor comprises retrieving the slope factor from a lookup table that includes the plurality of slope factors each based on a read disturb slope for each of the plurality of wordline groups.

4. The method of claim 3, wherein each of the plurality of slope factors is further based on an initial read window budget for each of the plurality of wordline groups.

5. The method of claim 3, further comprising:
   updating the slope factor in the lookup table based on a comparison of a read disturb slope for the wordline group to a reference read disturb slope of the plurality of read disturb slopes.

6. The method of claim 5, wherein the reference read disturb slope comprises a steepest read disturb slope of the plurality of read disturb slopes.

7. The method of claim 5, wherein each of the plurality of slope factors is further based on an initial read window budget for each of the plurality of wordline groups and wherein updating the slope factor is further based on a comparison of an initial read window budget for the wordline group to a reference initial read window budget of the plurality of initial read window budgets.

8. A non-transitory computer-readable storage medium comprising instructions that, when executed by a processing device, cause the processing device to:
   receive a read command including a logical address, wherein the read command is directed to a portion of memory composed of a plurality of blocks and wherein each of the plurality of blocks is composed of a plurality of wordline groups;
   identify a physical address for the read command using the logical address;
   determine a wordline group of the plurality of wordline groups using the physical address;

retrieve a slope factor of a plurality of slope factors using the wordline group; and increment a read counter using the slope factor.

9. The non-transitory computer-readable storage medium of claim 8, wherein the processing device is further to:
determine that the incremented read counter satisfies a read counter threshold; and
execute a data integrity scan in response to the incremented read counter satisfying the read counter threshold.

10. The non-transitory computer-readable storage medium of claim 8, wherein retrieving the slope factor comprises retrieving the slope factor from a lookup table that includes the plurality of slope factors each based on a read disturb slope for each of the plurality of wordline groups.

11. The non-transitory computer-readable storage medium of claim 10, wherein each of the plurality of slope factors is further based on an initial read window budget for each of the plurality of wordline groups.

12. The non-transitory computer-readable storage medium of claim 10, wherein the processing device is further to:
update the slope factor in the lookup table based on a comparison of a read disturb slope for the wordline group to a reference read disturb slope of the plurality of read disturb slopes.

13. The non-transitory computer-readable storage medium of claim 12, wherein the reference read disturb slope comprises a steepest read disturb slope of the plurality of read disturb slopes.

14. The non-transitory computer-readable storage medium of claim 12, wherein each of the plurality of slope factors is further based on an initial read window budget for each of the plurality of wordline groups and wherein updating the slope factor is further based on a comparison of an initial read window budget for the wordline group to a reference initial read window budget of the plurality of initial read window budgets.

15. A system comprising:
a plurality of memory devices; and
a processing device, operatively coupled with the plurality of memory devices, to:
receive a read command including a logical address, wherein the read command is directed to a portion of memory composed of a plurality of blocks and wherein each of the plurality of blocks is composed of a plurality of wordline groups;
identify a physical address for the read command using the logical address;
determine a wordline group of the plurality of wordline groups using the physical address;
retrieve a slope factor of a plurality of slope factors using the wordline group;
increment a read counter using the slope factor;
determine that the incremented read counter satisfies a read counter threshold; and
execute a data integrity scan in response to the incremented read counter satisfying the read counter threshold.

16. The system of claim 15, wherein retrieving the slope factor comprises retrieving the slope factor from a lookup table that includes the plurality of slope factors each based on a read disturb slope for each of the plurality of wordline groups.

17. The system of claim 16, wherein each of the plurality of slope factors is further based on an initial read window budget for each of the plurality of wordline groups.

18. The system of claim 16, wherein the processing device is further to:
update the slope factor in the lookup table based on a comparison of a read disturb slope for the wordline group to a reference read disturb slope of the plurality of read disturb slopes.

19. The system of claim 18, wherein the reference read disturb slope comprises a steepest read disturb slope of the plurality of read disturb slopes.

20. The system of claim 18, wherein each of the plurality of slope factors is further based on an initial read window budget for each of the plurality of wordline groups and wherein updating the slope factor is further based on a comparison of an initial read window budget for the wordline group to a reference initial read window budget of the plurality of initial read window budgets.

* * * * *